(12) United States Patent
Hess et al.

(10) Patent No.: US 9,389,635 B2
(45) Date of Patent: Jul. 12, 2016

(54) SELECTABLE PHASE OR CYCLE JITTER DETECTOR

(71) Applicant: Apple Inc., Cupertino, CA (US)

(72) Inventors: Greg M. Hess, Mountain View, CA (US); James E. Burnette, II, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/935,679

(22) Filed: Nov. 9, 2015

(65) Prior Publication Data

US 2016/0062388 A1   Mar. 3, 2016

Related U.S. Application Data

(62) Division of application No. 13/670,779, filed on Nov. 7, 2012, now Pat. No. 9,207,705.

(51) Int. Cl.
| | |
|---|---|
| *G01R 31/28* | (2006.01) |
| *G06F 1/04* | (2006.01) |
| *G01R 31/3185* | (2006.01) |
| *G01R 31/317* | (2006.01) |
| *H03M 1/08* | (2006.01) |
| *H03M 1/20* | (2006.01) |
| *H04L 1/20* | (2006.01) |
| *G11B 20/10* | (2006.01) |

(52) U.S. Cl.
CPC ............ *G06F 1/04* (2013.01); *G01R 31/31709* (2013.01); *G01R 31/31858* (2013.01); *G01R 31/318541* (2013.01); *G01R 31/318552* (2013.01); *G01R 31/318555* (2013.01); *G01R 31/318594* (2013.01); *H03M 1/0836* (2013.01); *G11B 20/10398* (2013.01); *H03M 1/205* (2013.01); *H04L 1/205* (2013.01)

(58) Field of Classification Search
CPC   G06F 1/04; G11B 20/10398; G01R 3/31709; G11C 2029/3202; H03M 1/0836; H04L 1/205; H04L 43/087
USPC ........................... 714/726, 731, 744; 375/226
See application file for complete search history.

(56) References Cited

U.S. PATENT DOCUMENTS

| | | | |
|---|---|---|---|
| 6,946,888 B2 * | 9/2005 | Lee | ........................ H03L 7/0805 327/158 |
| 7,120,215 B2 | 10/2006 | Li | |
| 7,454,674 B2 | 11/2008 | Hess | |
| 7,620,839 B2 * | 11/2009 | Chen | ......................... G06F 1/12 713/500 |
| 7,684,533 B2 | 3/2010 | Eckhardt | |
| 7,937,608 B2 | 5/2011 | Chen | |
| 8,144,756 B2 | 3/2012 | Lee | |
| 8,179,176 B2 | 5/2012 | Kang | |

(Continued)

*Primary Examiner* — Albert Decady
*Assistant Examiner* — Osman M Alshack
(74) *Attorney, Agent, or Firm* — Meyertons, Hood, Kivlin, Kowert & Goetzel, P.C.

(57) ABSTRACT

Embodiments of a jitter detection circuit are disclosed that may allow for detecting both cycle and phase jitter in a clock distribution network. The jitter detection circuit may include a phase selector, a data generator, a delay chain, a logic circuit, and clocked storage elements. The phase selector may be operable to select a clock phase to be used for the launch clock, and the data generator may be operable to generate a data signal responsive to the launch clock. The delay chain may generate a plurality of outputs dependent upon the data signal, and the clocked storage elements may be operable to capture the plurality of outputs from the delay chain, which may be compared to expected data by the logic circuit.

16 Claims, 10 Drawing Sheets

(56) References Cited

U.S. PATENT DOCUMENTS

| | | |
|---|---|---|
| 2001/0032323 A1 | 10/2001 | Takagi |
| 2003/0137912 A1* | 7/2003 | Ogura .................. G11B 20/10 369/47.39 |
| 2004/0130985 A1 | 7/2004 | Chao |
| 2004/0217788 A1* | 11/2004 | Kim ..................... H03L 7/089 327/158 |
| 2005/0062510 A1* | 3/2005 | Zarate ................. H03L 7/0814 327/158 |
| 2005/0107970 A1 | 5/2005 | Franch |
| 2007/0157057 A1* | 7/2007 | Hess ................ G01R 31/31709 714/724 |
| 2007/0283184 A1* | 12/2007 | Hsu ...................... H04L 7/0338 713/501 |
| 2008/0012549 A1 | 1/2008 | Kam |
| 2008/0075221 A1* | 3/2008 | Lai ....................... H04L 7/0338 375/376 |
| 2009/0271133 A1* | 10/2009 | Ho ........................ G01R 29/26 702/69 |
| 2010/0039157 A1* | 2/2010 | Kaeriyama ............... G06F 1/08 327/292 |
| 2010/0268522 A1 | 10/2010 | Bhanji et al. |
| 2012/0066559 A1 | 3/2012 | Chien |

* cited by examiner

SELECTABLE PHASE OR CYCLE JITTER DETECTOR

PRIORITY INFORMATION

This application is a divisional of U.S. patent application Ser. No. 13/670,779, entitled "SELECTABLE PHASE OR CYCLE JITTER DETECTOR," filed Nov. 7, 2012, which is hereby incorporated by reference in its entirety as though fully and completely set forth herein.

BACKGROUND

1. Technical Field

Embodiments described herein are related to the field of integrated circuit design, and more particularly, to detecting jitter on an integrated circuit.

2. Description of the Related Art

Digital logic designs generally include asynchronous logic blocks separated by clocked storage circuits. At the beginning of a clock cycle, the clocked storage circuits launch previously stored logic signals into an asynchronous logic block. The logic signals then propagate through the asynchronous logic block and are operated on in accordance with the logic function implemented in the asynchronous logic block. At the end of the clock cycle, the resultant logic signals are captured by another set of clocked storage elements.

In real integrated circuits, however, clock signals are not ideal. The period of a clock signal may vary from one cycle to another. This variation in a clock signal is commonly referred to as "jitter," and may have numerous sources such as, variations in the clock generator (phase-locked loop), variation in power supply voltages, capacitive or inductive coupling into the clock signal from other nearby signals, and the like.

When designing digital logic circuits, digital logic designs allow for a certain amount of jitter (commonly referred to as "adding margin") which limits the effect portion of a clock cycle in which logic work may be done. In some cases the added margin is estimated based on an analysis of the clock generation circuits, such as, e.g., phase-locked loops, characteristics of the semiconductor manufacturing process that will be used to fabricate the design, the clock distribution network, etc. After fabrication, the actual circuit may experience less jitter than estimated which would allow for a higher operation frequency. Alternatively, the actual circuit may be experience more jitter than estimated, which may prevent the circuit from achieving intended performance goals.

SUMMARY OF THE EMBODIMENTS

Various embodiments of circuit for determining the jitter of integrated circuit are disclosed. Broadly speaking, a circuit and a method are contemplated in which, a launch clock phase may be selected. A data signal may be generated by a data generator signal in response to the launch clock. The data signal may then be delayed to generate a plurality of delayed data signals. Each of the delayed data signals may then be captured by a plurality of clocked storage elements. A detector circuit may then compare the outputs of the plurality of clocked storage elements to determine which of the delayed data signals were captured in error. A storage circuit may accumulate an indication of which of the delayed data signals were captured in error.

In another embodiment, the frequency of the data signal may be half of the frequency of the launch clock. The accumulation of the indication of delay data signals were captured in error may be reset in response to a reset signal.

In a further embodiment, the delay generator signal may provide two delay offsets to the delay signal. The determination of which delay offset to provide may be dependent upon the phase of the launch clock.

BRIEF DESCRIPTION OF THE DRAWINGS

The following detailed description makes reference to the accompanying drawings, which are now briefly described.

Figure 1:
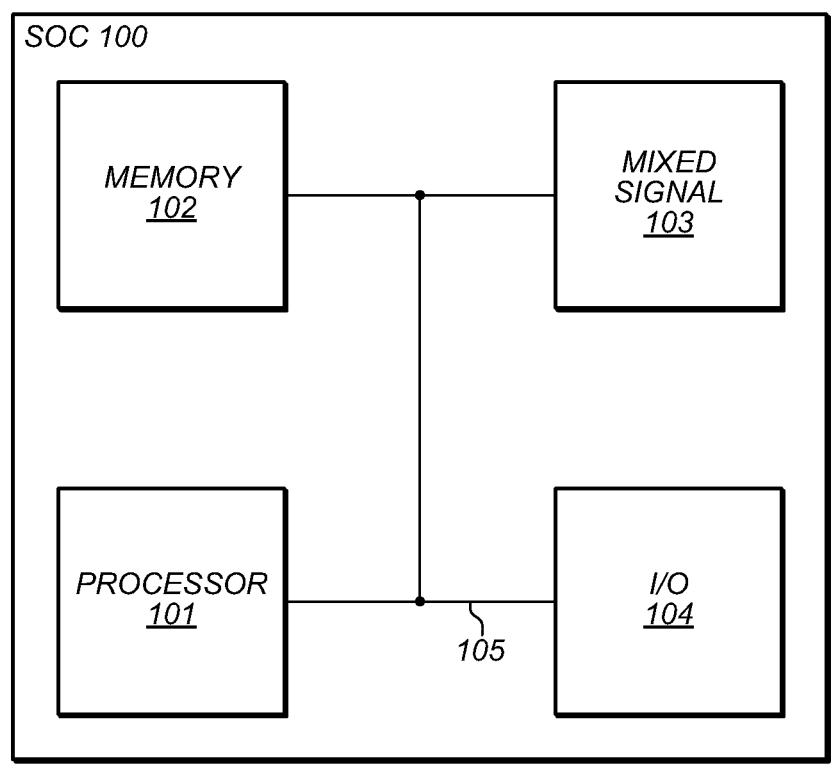
FIG. 1 illustrates an embodiment of a system on a chip.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component. More generally, the recitation of any element is expressly intended not to invoke 35 U.S.C. §112, paragraph six interpretation for that element unless the language "means for" or "step for" is specifically recited.

DETAILED DESCRIPTION OF EMBODIMENTS

A system on a chip (SoC) may include one or more functional blocks, such as, e.g., a microcontroller or a memory, which may integrate the function of a computing system onto a single integrated circuit. Some of the functional blocks may include synchronous logic circuit with an accompanying clock distribution network. Variation in power supply voltages across the SoC, capacitive and inductive coupling into the clock signal and variation within clock generation circuits may result in jitter in the distributed clock. Digital designers may attempt to estimate the jitter, and add margin to the design (i.e., reduce the effective clock period available for performing logical work) to account for the estimated jitter. On actual SoCs, however, actual jitter may be not be as estimated, resulting in an over margined design, or a design with timing marginalities. Having an actual measure of clock jitter may allow for improved timing in future designs. The embodiments illustrated in the drawings and described below may provide techniques for measuring clock jitter.

System on a Chip Overview

A block diagram of an SoC is illustrated in FIG. 1. In the illustrated embodiment, the SoC 100 includes a processor 101 coupled to memory block 102, and analog/mixed-signal block 103, and I/O block 104 through internal bus 105. In various embodiments, SoC 100 may be configured for use in a mobile computing application such as, e.g., a tablet computer or cellular telephone.

Processing device 101 may, in various embodiments, be representative of a general-purpose processor that performs computational operations. For example, processing device 301 may be a central processing unit (CPU) such as a microprocessor, a microcontroller, an application-specific integrated circuit (ASIC), or a field-programmable gate array (FPGA).

In some embodiments, processing device 101 may implement any suitable instruction set architecture (ISA), such as, e.g., the ARM™, PowerPC™, or x86 ISAs, or combination thereof. Processing device 101 may include one or more clocked storage elements, such as latches or flip-flops, for example, that may be coupled to a system clock.

Memory block 102 may include any suitable type of memory such as a Dynamic Random Access Memory (DRAM), a Static Random Access Memory (SRAM), a Read-only Memory (ROM), Electrically Erasable Programmable Read-only Memory (EEPROM), or a FLASH memory, for example. It is noted that in the embodiment of an SoC illustrated in FIG. 1, a single memory block is depicted. In other embodiments, any suitable number of memory blocks may be employed.

Analog/mixed-signal block 103 may include a variety of circuits including, for example, a crystal oscillator, a phase-locked loop (PLL), an analog-to-digital converter (ADC), and a digital-to-analog converter (DAC) (all not shown). In other embodiments, analog/mixed-signal block 103 may be configured to perform power management tasks with the inclusion of on-chip power supplies and voltage regulators. Analog/mixed-signal block 103 may also include, in some embodiments, radio frequency (RF) circuits that may be configured for operation with cellular telephone networks.

In some embodiments, a PLL in analog/mixed-signal block 103 may be configured to provide a system clock to SoC 100. Additional circuit blocks such as, e.g., clock gating circuits and clock buffer circuits, may be employed in conjunction with a PLL to generate additional clocks that may used through SoC 100.

I/O block 104 may be configured to coordinate data transfer between SoC 100 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, I/O block 104 may be configured to implement a version of Universal Serial Bus (USB) protocol or IEEE 1394 (Firewire®) protocol.

I/O block 104 may also be configured to coordinate data transfer between SoC 100 and one or more devices (e.g., other computer systems or SoCs) coupled to SoC 100 via a network. In one embodiment, I/O block 104 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, I/O block 104 may be configured to implement multiple discrete network interface ports.

It is noted that the SoC illustrated in FIG. 1 is merely an example. In other embodiments, different functional blocks may be included.

Clocking Overview and Clock Jitter

Figure 2:
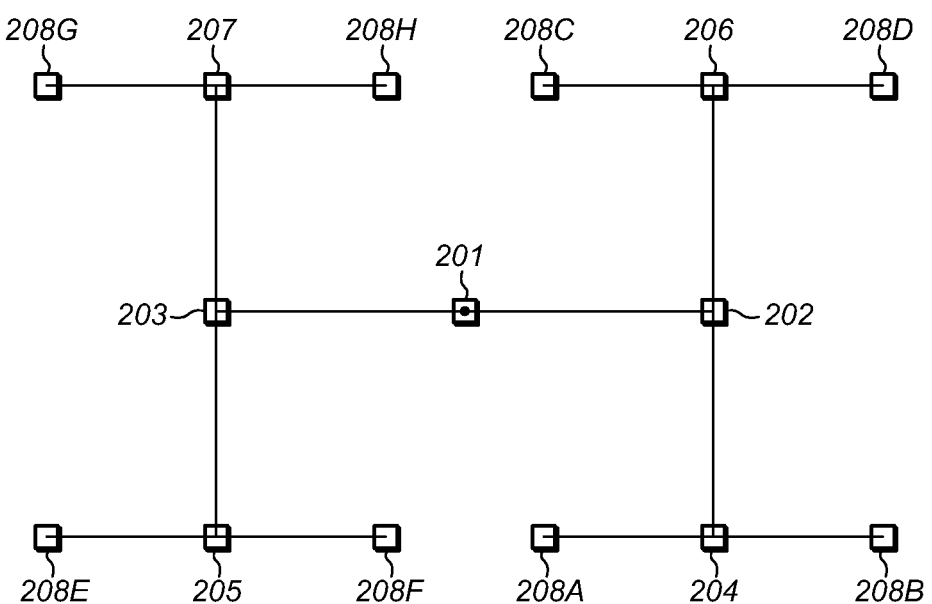
FIG. 2 illustrates an embodiment of a clock distribution network.

Turning to FIG. 2, an embodiment of a clock distribution (commonly referred to as a "clock tree") network is illustrated. In the illustrated embodiment, primary clock buffer 201 is coupled to clock buffers 203 and 202. Clock buffer 203 is further coupled to clock buffers 205 and 207, and clock buffer 202 is further coupled to clock buffers 204 and 206. Clock buffer 204 is further coupled to circuits 208A and 208B, and clock buffer 206 is further coupled to circuits 208C and 208D. Clock buffer 205 is further coupled to circuits 208E and 208F, and clock buffer 207 is further coupled to circuits 208G and 208H. In some embodiments the load (both gate and wire loading) for corresponding portions of the clock distribution network may be same. For example, the total load coupled to clock buffer 206 may be the same as the total load coupled to clock buffer 204.

Primary clock buffer 201, and block buffers 202 through 207 may include two series inverters, or any suitable circuit for amplifying a clock signal. It is noted that static complementary metal-oxide-semiconductor (CMOS) inverters, such as those shown and described herein, may be a particular embodiment of an inverting amplifier that may be employed in the circuits described herein. However, in other embodiments, any suitable configuration of inverting amplifier that is capable of inverting the logical sense of a signal may be used, including inverting amplifiers built using technology other than CMOS.

Figure 3:
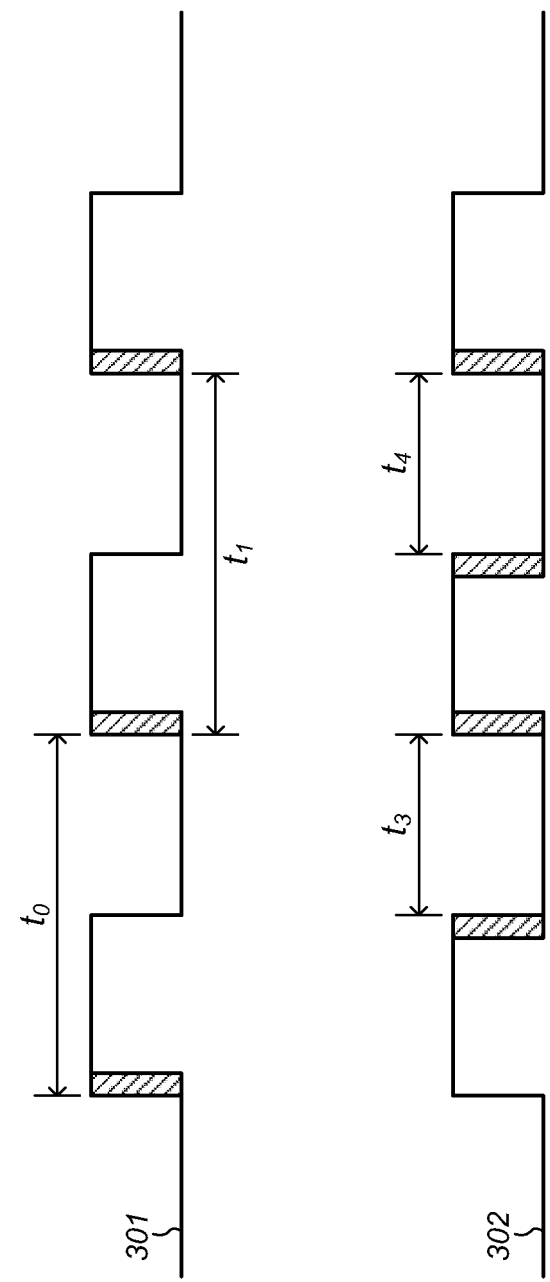
FIG. 3 illustrates an example clock waveform.

Example clock waveforms from a clock distribution network are illustrated in FIG. 3. In some embodiments, the illustrated waveforms may correspond to the output of a clock buffer circuit such as, clock buffer 208A as depicted in FIG. 2, for example.

Variation in clock waveforms may occur at both the rising edge and the falling edge of a clock signal. Clock waveform 301 depicts a case where the variation in the clock signal is occurring on the rising edge of clock. In such a case, the period of a clock cycle may vary from one cycle to the next as the rising edges occur within a range of uncertainty. For example, in the illustrated waveform, clock period t0 may be greater than clock period t1, or alternatively, clock period t0 may be less clock period t1. This type of jitter (commonly referred to as "cycle jitter") is critical to timing logic paths within a design where the launch and capture clocks use the same phase, i.e., full-cycle paths.

Clock waveform 302 depicts a case where the variation in the clock signal is occurring on both the rising and falling edges of clock. In such cases, the duty cycle of the clock may vary from cycle to cycle. For example, in the illustrated waveform, half clock period t3 may be greater than half clock period t4, or alternatively, half clock period t3 may be less that half clock period t4. This type of jitter (commonly referred to as "phase jitter") is critical to timing logic paths within a design where the launch and capture clocks use opposite phase, i.e., half-cycle paths.

It is noted that the waveforms illustrated in FIG. 3 are merely an example. In other embodiments, different waveforms resulting from different clock distribution networks and clock buffers are possible.

Jitter Detection

Figure 4:
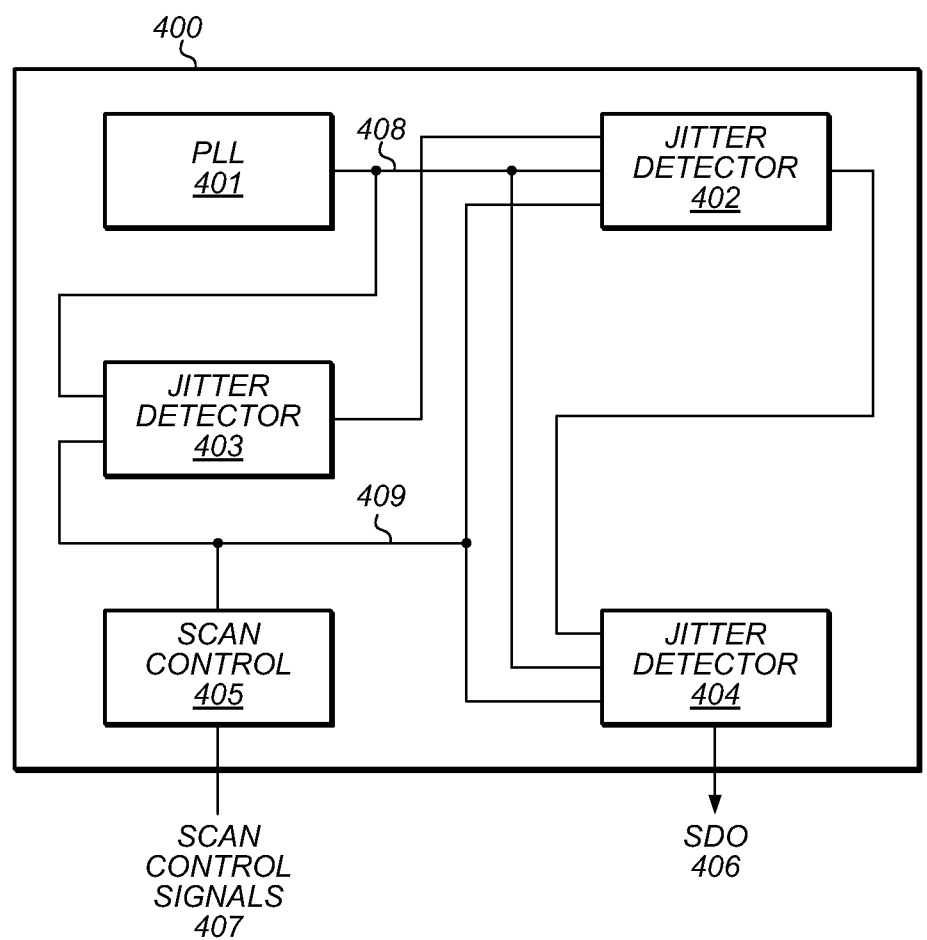
FIG. 4 illustrates block diagram of an integrated circuit including one or more jitter detectors.

Turning to FIG. 4, an embodiment of an integrated circuit, such as SoC 100 as depicted in FIG. 1, with multiple jitter detection circuits is illustrated. In the embodiment illustrated, integrated circuit 400 includes PLL 401, jitter detectors 402 through 404, and scan control circuit 405. One or more clock buffers (not shown), such as clock buffers 201 through 207 illustrated in FIG. 2, may also be include in integrated circuit 400.

PLL 401 is coupled to jitter detectors 402 through 404 via clock 408. Each of jitter detectors 402 through 404 are coupled to scan control circuit 405, and may also be coupled into a scan chain (e.g., from jitter detector 402, to jitter detector 403, to jitter detector 404, to scan data out 406, via scan chain 409). In various other embodiments, jitter detectors 402 through 404 may be coupled into separate scan chains.

PLL 401 may be configured to generate one or more clocks of various frequencies using an input clock as a phase reference. In some embodiments, PLL may include a voltage-controlled oscillator, a phase detector, and a loop filter. The phase detector may be implemented as a phase multiplier, or a digital detector such as, e.g., an edge-triggered JK flip-flop, or any other suitable phase detection circuit.

Scan control circuit 405 is coupled to receive scan control signals 407. In some embodiments, the scan control signals may be received from a source external to integrated circuit 400, such as, a tester, for example. Scan control signals 407 may also be provided by built-in self-test (BIST) circuitry included in integrated circuit 400 or included in another integrated circuit as part of a larger computing system.

During operation, PLL 401 generates clock 408, which is distributed across integrated circuit 400. An H-tree clock distribution system (not shown), or any other suitable clock distribution method may be used to distribute the clock. At various places in the clock network, jitter detector, such as, e.g., jitter detectors 402 through 404, may be connected to the distributed clock. During a test mode, jitter detectors 402 through 404 may be activated, thereby measuring the jitter at the locations in the clock network at the locations where the jitter detectors have been placed. Cycle jitter or phase jitter may be measured. In some embodiments, the selected type of jitter may be measured over numerous clock cycles, and the results transferred from the integrated circuit through a test mode, such as scan test mode, for example.

It is noted that in the embodiment illustrated in FIG. 4, three jitter detectors were employed. In various other embodiments, any number of jitter detectors may be used.

Figure 5:
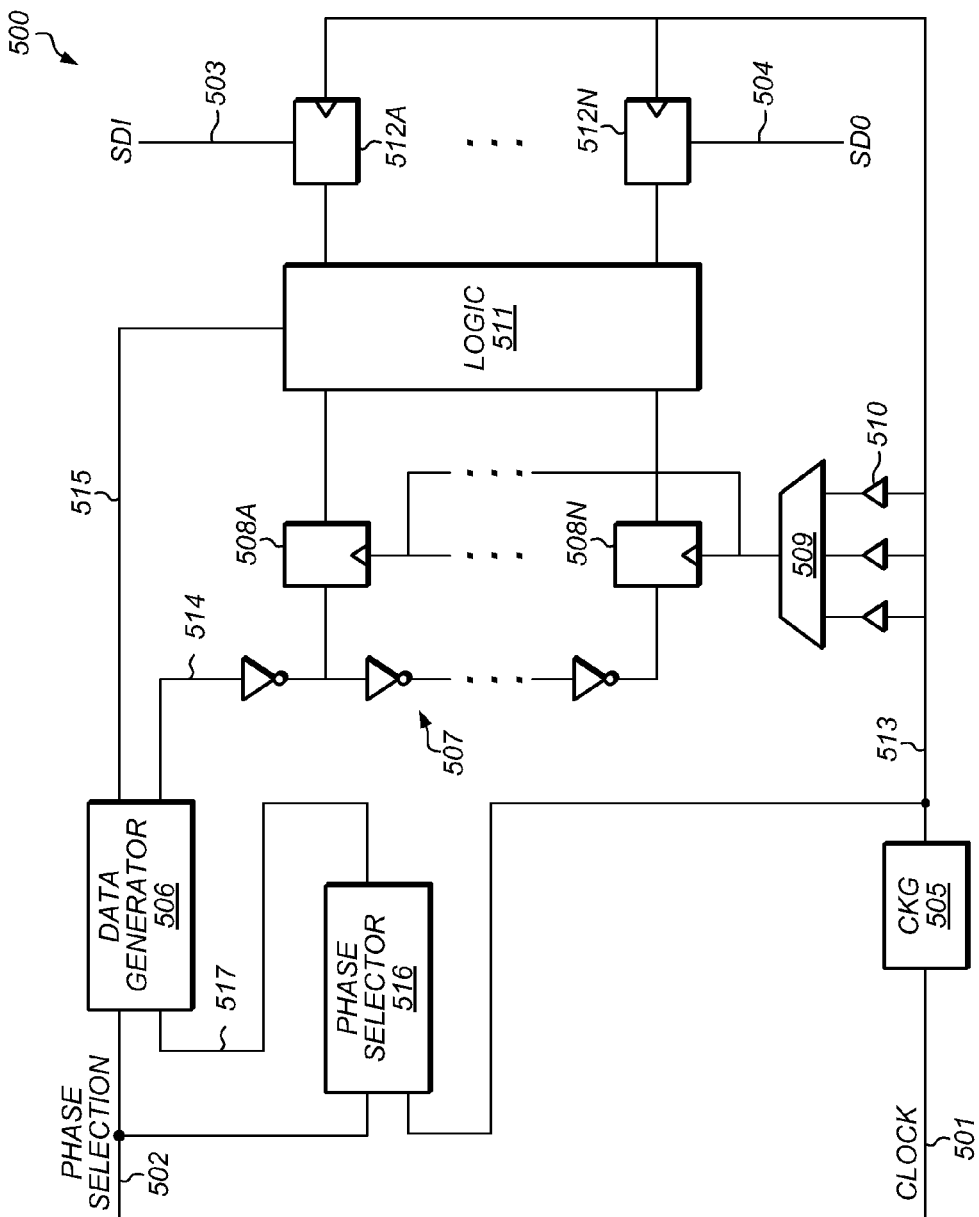
FIG. 5 illustrates an embodiment of a jitter detector.

Turning to FIG. 5, an embodiment of a jitter detection circuit is illustrated. The illustrated embodiment includes phase selection input 502, clock input 501, scan data input 503 denoted "sdi," and scan data output 504 denoted "sdo." In various embodiments, jitter detector 500 may correspond to any or all of jitter detectors 402 through 404 used in integrated circuit 400 as illustrated in FIG. 4.

Clock input 501 is coupled to clock generator circuit 505, which creates internal clock 513 which is coupled to phase selector 516, clocked storage elements 512A through 512N, and to delay elements 510, which are in turn, coupled to multiplex circuit 509. The output of multiplex circuit 509 provides the capture clock for clocked storage elements 508A through 508N. Data signal 514 is coupled to the input of delay chain 514, and check signal 515 is coupled to logic circuit 511. The outputs from delay chain 507 are coupled to data inputs of clocked storage elements 508A through 508N, and data outputs from clocked storage elements 508A through 508N are coupled to logic circuit 511. The outputs of logic circuit 511 are coupled to data inputs of clocked storage elements 512A through 512N.

Clocked storage elements 508A through 508N, and 512A through 512N, may be implemented in accordance with one of various design styles. In some embodiments, D-type flip-flops may be employed. Clocked latches, register file style storage cells, or any suitable clocked storage circuit may be employed in other embodiments.

Delay chain 507 may be configured to generate a plurality of outputs responsive to data signal 514, each output being delay from data signal 514 by a different amount. In some embodiments, delay chain 507 may include a plurality of delay elements, such as, e.g., inverters or buffers, to produce the plurality of outputs. Other delay elements, such as, current starved inverters, for example, may also be employed.

Clock generator 505 may be configured to generate internal clock 513. Clock buffers and clock gating circuits may be included in clock generator 505 in some embodiments. In other embodiments, clock generator 505 may include a multiplex circuit to allow for the jitter detector 500 to be used with multiple input clocks (not shown).

Figure 6:
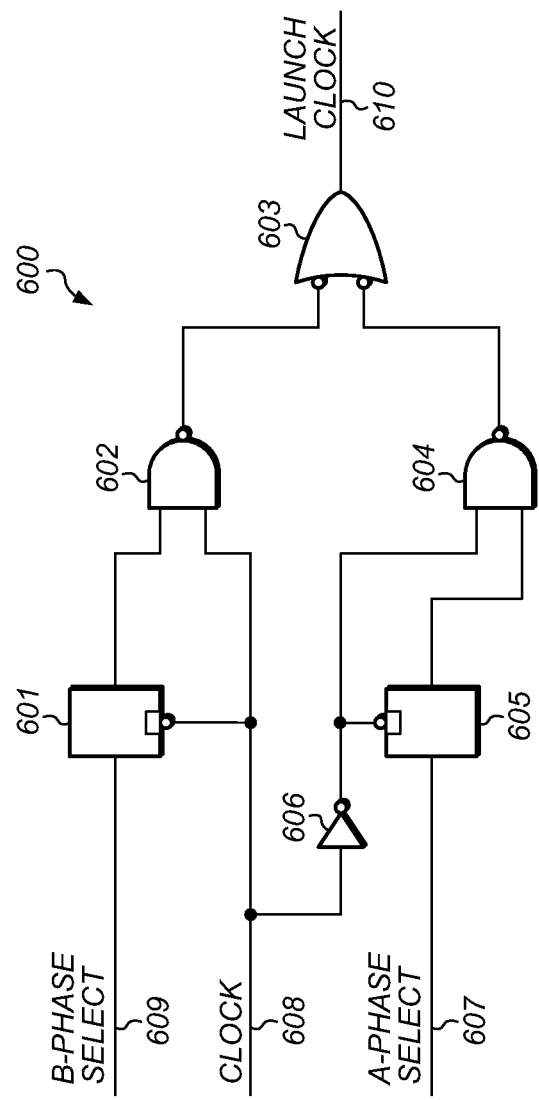
FIG. 6 illustrates an embodiment of a clock phase selection circuit.

Phase selector circuit 516 may be configured to select the phase of internal clock 513 for use as the launch clock, as described below in more detail in reference to phase selector 600 as illustrated in FIG. 6. In some embodiments, phase selector circuit 516 may employ flip-flops and logic gates, in any suitable configuration, to generate the launch clock dependent upon the phase selection signal.

Figure 7:
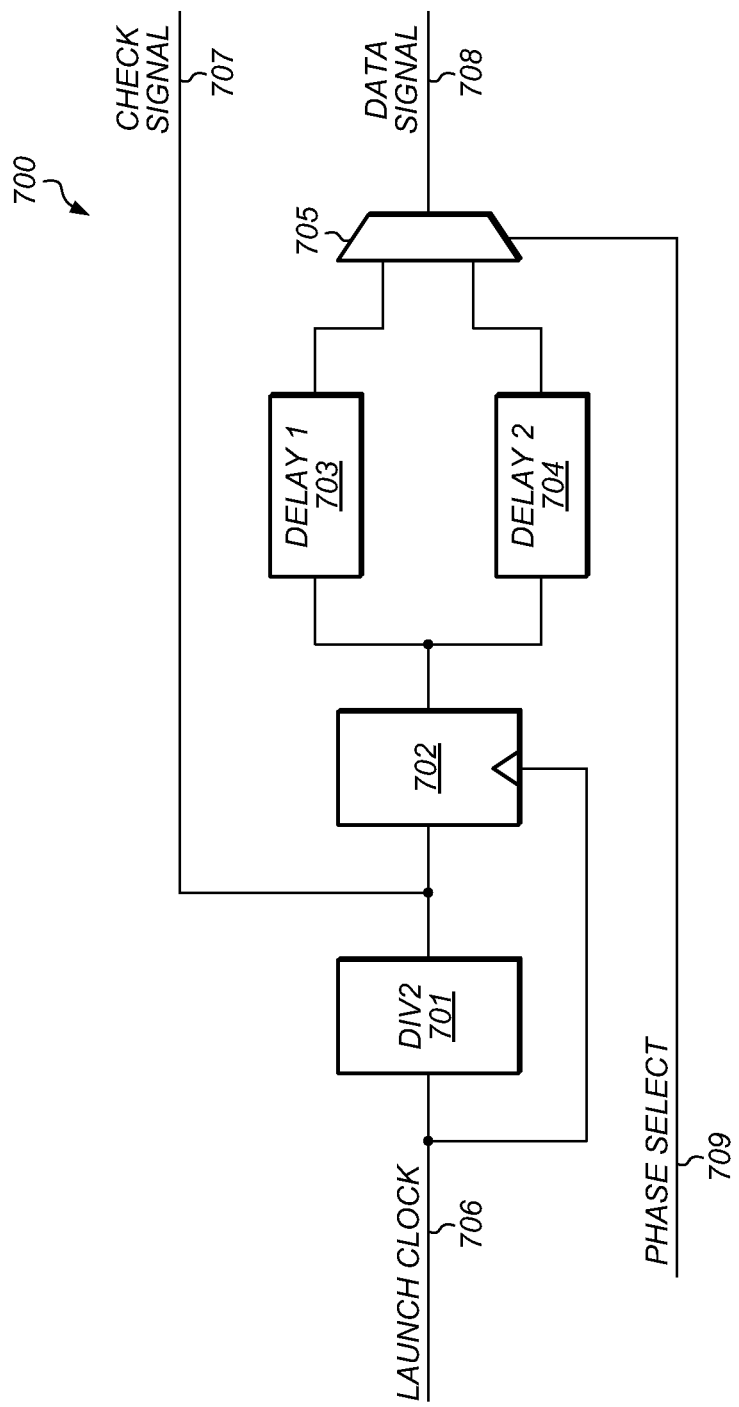
FIG. 7 illustrates an embodiment of a data generator circuit.

In some embodiments, data generator 506 may be configured to add a delay offset dependent upon phase selection input 502, as described below in more detail in reference to data generator 700 as illustrated in FIG. 7. The delay offset may be implemented as an equivalent critical path that may be extracted from the mask design of processor or SoC. In other embodiments two equivalent critical paths may be employed, the first corresponding to a full-cycle path, and the second corresponding to a half-cycle path.

Figure 8:
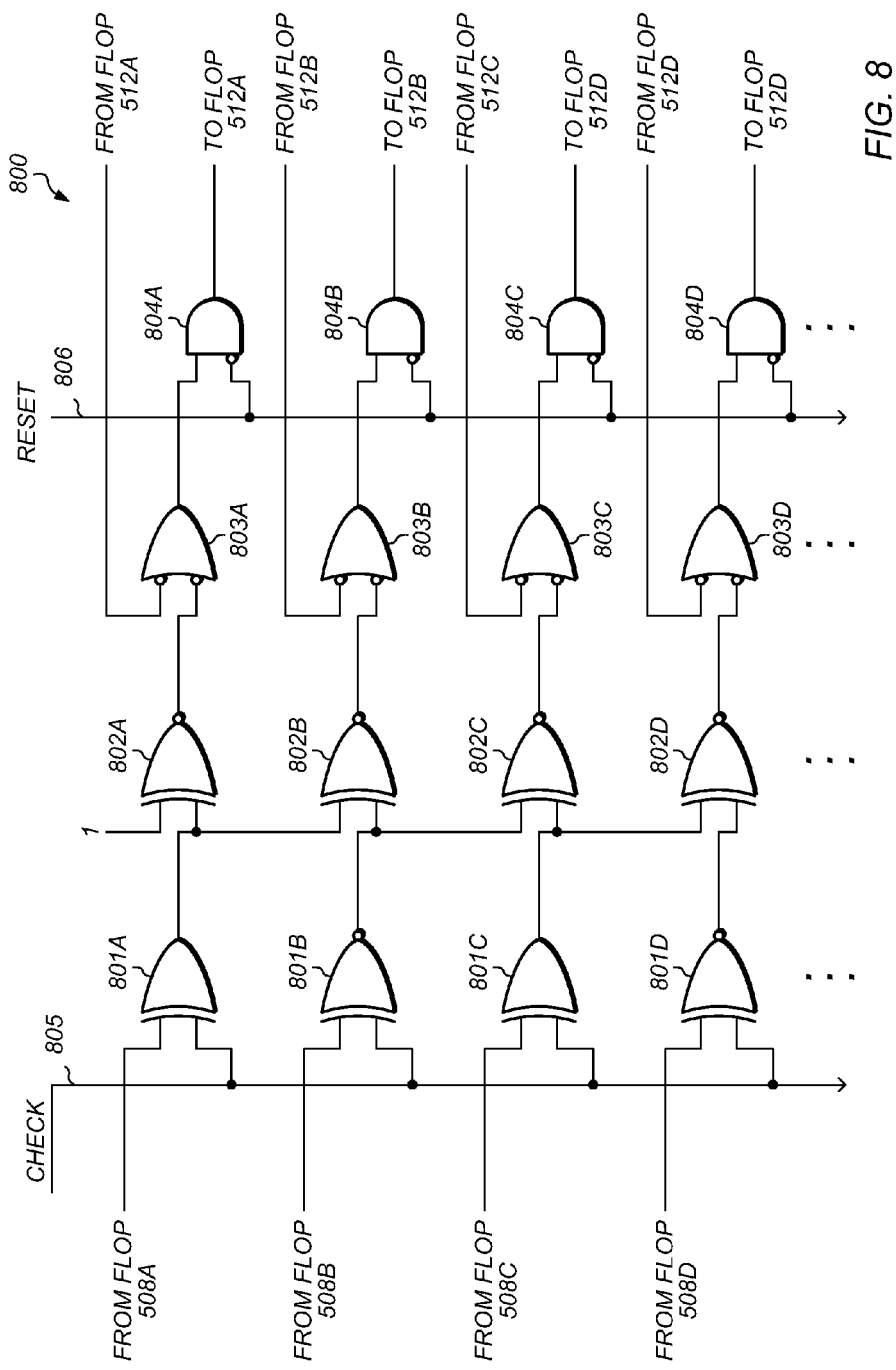
FIG. 8 illustrates an embodiment of a captured data comparison circuit.

Logic circuit 511 may be configured to check data outputs from clocked storage elements 508A through 508N against check signal 515, as described below in more detail in reference to logic circuit 800 as illustrated in FIG. 8. The results of the comparison may then be output to clocked storage elements 512A through 512N. In some embodiments, logic circuit 511 may be configured to determine the first occurrence of data from delay chain 507 that is captured in error by clocked storage elements 508A through 508N.

It is noted that the jitter detector illustrated in FIG. 5 is merely an example. In various embodiments, different numbers of clocked storage elements and delay chain elements may be employed.

An embodiment of a phase selection circuit is illustrated in FIG. 6. The illustrated embodiment includes a clock input 608, an A-phase selection signal 607, a B-phase selection signal 609, and a launch clock output 610.

Input clock signal 608 is coupled to inverter 606, NAND gate 602, level sensitive latch 601, which is further coupled to NAND gate 602. The output of inverter 606 is coupled to NAND gate 604 and level sensitive latch 605, which is further coupled to NAND gate 604. The output of NAND gate 602 and the output of NAND gate 604 are both coupled to NAND gate 603, whose output forms launch clock 610. While NAND gates and inverters are illustrated in FIG. 6, any suitable combination of Boolean logic gates is possible.

During operation, the outputs of level sensitive latches 601 and 605 may be allowed to transition in response to the rising edge of their respective clock inputs. For example, when A-phase selection signal 607 is at a high logic level, and B-phase selection signal 609 is at a low logic level, the positive phase of input clock signal 608 is selected as the launch clock output 610, and when B-phase selection signal 609 is at a high logic level and A-phase selection signal 607 is at a low logic level, the negative phase (i.e., the logic low period) of input clock signal 608 may be selected as launch clock output 610.

When both A-phase selection signal 607 and B-phase selection signal 609 are both at low logic levels, launch clock output 610 may be inactive. In some embodiments, the condition when A-phase selection signal 607 and B-phase selection signal 609 are both at high logic levels may be a disallowed state, and may be detected and prevented by additional circuit coupled to phase selection circuit 600.

It is noted that "low" or "low logic level" refers to a voltage at or near ground and that "high" or "high logic level" refers to a voltage level sufficiently large to turn on a n-channel MOSFET and turn off a p-channel MOSFET. In other embodiments, different technology may result in different voltage levels for "low" and "high."

The phase selection circuit illustrated in FIG. 6 is merely an example. In other embodiments, different circuits, such as, multiplexors, for example, may be employed to select the clock phase of the input clock signal to be used as the launch clock.

Turning to FIG. 7, an embodiment of a data generation circuit is illustrated. In the embodiment illustrated in FIG. 7, data generation circuit 700 includes a clock input 706, a check signal output 707, phase selection input 709, and a data signal output 708. In some embodiments, clock input 706 may correspond to a launch clock such as launch clock output 610 of phase selection circuit 600 as illustrated in FIG. 6.

In the illustrated embodiment, clock input 706 is coupled to divide-by-two circuit 701 and launch flip-flop 702. Divide-by-two circuit 701 is further coupled to check signal output 707 and launch flip-flop 702 which is, in turn, coupled to delay circuit 703 and delay circuit 704. The output of delay circuit 703 and the output of delay circuit 704 are coupled to multiplexor 705, which is coupled to data signal output 708, and controlled by phase selection input 709.

Divide-by-two circuit 701 may include a D-type flip-flop whose output is configured to toggle at half of the frequency of a signal coupled to its D-input. In other embodiments, different frequency division techniques may be employed. For example, a digital counter, such as, e.g., a Johnson counter, or an analog regenerative frequency divider may be used.

Delay circuits 703 and 704 may include inverters, buffers, or other CMOS logic gates, connected in series. In some embodiments, the included logic gates may each have the same load (also referred to as "fanout"). Other circuits such as current starved inverters, or any suitable circuit for generating delay, may also be employed. In various embodiments, delay circuits 703 and 704 may be representative of extracted timing critical circuit paths within an integrated circuit, and the delay of the two delay circuits may be representative of either full-cycle or half-cycle paths within a logic block of an integrated circuit or SoC, such as SoC 100, for example.

Flip-flop 702 may be implement according to one of various clocked sequential circuit design styles. In some embodiments, flip-flop 702 may be implemented using sets of cross-coupled NAND or NOR gates. Tri-state (as referred to as "clocked") inverters connected in a wired-OR fashion may also be employed to implement flip-flop 702.

In various embodiments, multiplexor 705 may be implemented in accordance with one of various design styles. Combinatorial logic gates may be used to implement the multiplex logic function. Alternatively, tri-state inverters coupled in a wired-OR fashion, or CMOS pass-gates (also referred to as "transmission gates") may be employed to implement the multiplex function.

During operation, the frequency input clock signal, which in some embodiments, may correspond to the output of phase selection circuit 600 as illustrated in FIG. 6, is divided in half by divide-by-two circuit 701. The reduced frequency signal may then be output as check signal output 707. Flip-flop 702 toggles in response to the clock input 706 and dependent on the output of divide-by-two circuit 701. In some embodiments, flip-flop 702 may output a data signal, which changes logic levels with each cycle of input clock 706.

Delay circuits 703 and 704 may then delay the output of flip-flop 702. In some embodiments delay circuit 703 may provide a delay for use with a full-cycle path jitter measurement, and delay circuit 704 may provide a delay for use with a half-cycle path jitter measurement. Multiplexor 705 then controllably selects between the two delayed signals output from delay circuits 703 and 704. In other embodiments, delay circuit 703 and delay circuit 704 may each provide a delay corresponding to a half-cycle path, and may be connected in a serial fashion to provide delay corresponding to a full-cycle path.

The data generation circuit illustrated in FIG. 7 is merely an example. In other embodiments, different circuit blocks and different configurations of circuit blocks are possible and contemplated.

An example logic circuit is illustrated in FIG. 8. In the illustrated embodiment, logic circuit 800 includes check input 805, reset input 806, inputs from clocked storage elements (flops) 508A through 508D, and inputs from and outputs to clocked storage elements (flops) 512A through 512D. In some embodiments, logic circuit 800 may correspond to logic circuit 511 of jitter detector 500 as illustrated in FIG. 5.

Each of the inputs received from clocked storage elements 508A through 508D, are compared against check input 805 by exclusive-OR gates 801A and 801C, and exclusive-NOR gates 801B and 801D. In various embodiments, some of the inputs received from clocked storage elements 508A through 508D may be inverted, and different combinations of logic gates may be used in logic circuit 800.

Exclusive-NOR gates 802A through 802D then compare the outputs of exclusive-OR gates 801A through 801D to determine the first occurrence of data captured in error (the captured data does not match the expected data) by clocked storage elements 508A through 508D.

NAND gates 803A through 803D are configured to accumulate the jitter over multiple clock cycles. Each OR gates receives an active low signal from the output of one of exclusive-NOR gates 802A through 802D as well as the inverse of a corresponding output of clocked storage elements 512A through 512D. When one of NAND gates 803A through 803D receives a low logic levels on one of its inputs, the NAND gate will generate a high logic level as output. In cases when reset 806 is low, the high logic level is passed through the corresponding AND gate of AND gates 804A through 804D, to set the corresponding clocked storage element of clocked storage elements 512A through 512D. When reset 806 is high, the outputs of AND gates 804A through 804D may be set to a low logic level, thereby resetting the value in each of clocked storage elements 512A through 512D.

For the purposes of clarity, only for data bits are shown being compared in logic circuit 800 illustrated in FIG. 8. In other embodiments, different numbers of bits, and different configurations of logic gates are possible and contemplated.

Figure 9:
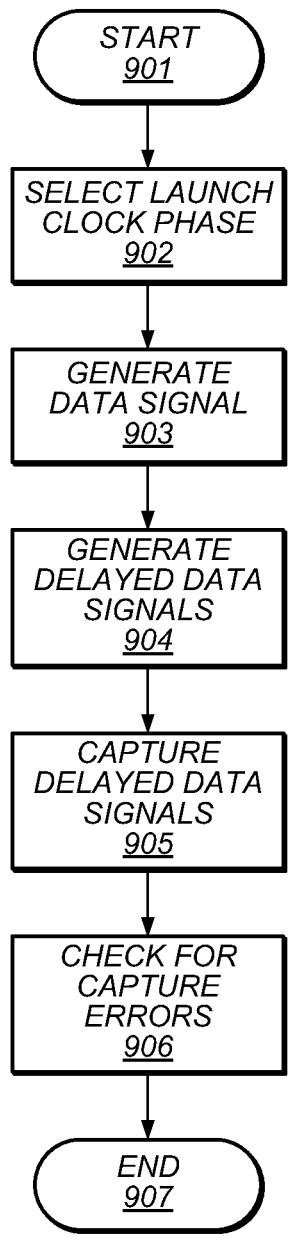
FIG. 9 illustrates a flowchart depicting a method of determining jitter for a clock cycle.

Turning to FIG. 9, a flowchart depicting a method of detecting jitter over a clock cycle is illustrated. Referring collectively to FIG. 5 and the flowchart of FIG. 9, the method begins in block 901. A launch clock phase is then selected by activating clock phase selection signal 502 (block 902). In some embodiments, a launch clock phase may be selected so that cycle-to-cycle jitter may be measured, while in other embodiments, a launch clock phase may be selected so that phase jitter may be measured.

Data generator 506 may then generator data signal 514 for input to delay chain 507 (block 903). In some embodiments, the data signal may be generated using a circuit such a data generator 600 as illustrated in FIG. 6. The delay offset of the generated data signal may be dependent on the selected launch clock phase. A plurality of delayed data signals is then generated by delay chain 507 (block 904) as described above in reference to the operation of jitter detector 500 illustrated in FIG. 5.

Flip-flops 508A through 508N are then activated to capture the plurality of delayed signals generated by delay chain 507 (block 905). The captured signals are then compared to expected data by logic circuit 511 detect which of the plurality of delayed signals were captured in error (block 906) and note the capture error that occurred first relative to the delayed signals. The method then concludes in block 907.

It is noted that the method illustrated in FIG. 9 is merely an example. Different operations and different orders of operations are possible in various embodiments.

Figure 10:
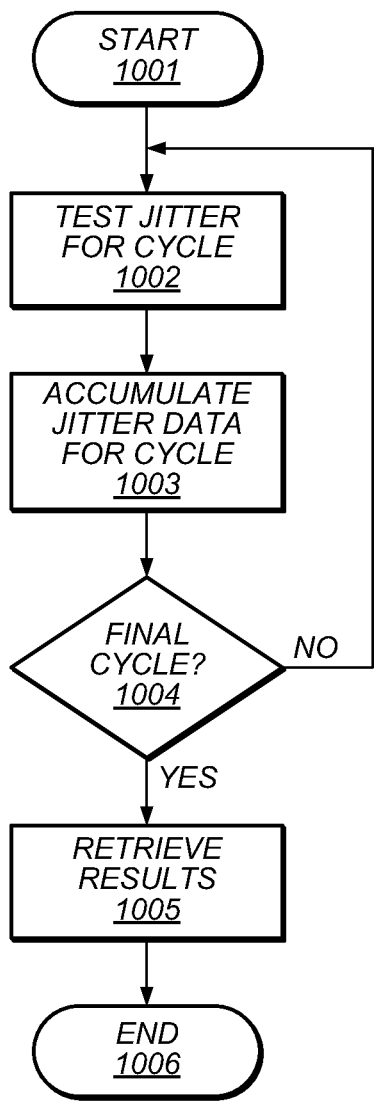
FIG. 10 illustrates a flowchart depicting a method of accumulating jitter data over multiple clock cycles.

A flowchart depicting an embodiment of a method for measuring jitter over a number of clock cycles is illustrated in FIG. 10. The method begins in block 1001. The jitter is then measured for a single cycle (block 1002). The single cycle jitter measure may, in some embodiments, be performed in accordance with method illustrated in FIG. 9. Once the jitter has been measured for the single cycle, the results of which delayed signals were captured in error may be accumulated (block 1003). In some embodiments, the accumulation of capture errors may be performed by flip-flops or other storage elements, such as, e.g., clocked storage elements 512A through 512N of jitter detector 500 as illustrated in FIG. 5.

The method then depends on whether or not a termination condition has been achieved (block 1004). In some embodiments, the termination condition may be that the measurement of a pre-determined number of clock cycles has been reached. When the termination condition has not been achieved, the jitter of another clock cycle is measured (block 1002). When the termination condition has been achieved, the results of the jitter measurement accumulated to that point are retrieved (block 1005). The retrieval may be accomplished through the use of a scan chain as described above in more detail in reference to FIG. 5, or any other suitable test data retrieval method.

The method illustrated in FIG. 10 is merely an example. Although the operations are depicted as being performed sequentially, in other embodiments, some or all of the operations may be performed in parallel.

Numerous variations and modifications will become apparent to those skilled in the art once the above disclosure is fully appreciated. It is intended that the following claims be interpreted to embrace all such variations and modifications.

What is claimed is:

1. An apparatus, comprising:
    a clock generation circuit configured to generate a clock signal; and
    one or more jitter detection circuits configured to:
        generate a launch clock dependent on the clock signal and a launch phase selection signal;
        generate a data signal dependent upon the launch clock;
        generate a capture clock dependent on the clock signal;
        generate a plurality of delayed signals dependent upon the data signal;
        capture a respective one of the plurality of delayed signals responsive to the capture clock to generate a plurality of captured signals; and
        identify one or more delayed signals of the plurality of delayed signals that were incorrectly captured dependent upon the plurality of captured signals;
        wherein the launch phase selection signal includes a first launch phase signal and a second launch phase signal, and wherein to generate the launch clock, each jitter detection circuit is further configured to select a positive phase of the clock signal in response to a determination that a value of the first launch phase signal captured in a first latch dependent upon the positive phase of the clock signal is a high logic level, and a value of the second launch phase signal captured in a second latch dependent upon a negative phase of the clock signal is a low logic level.

2. The apparatus of claim 1, wherein to generate the plurality of delayed signal, each jitter detection circuit is further configured to delay each delayed signal from the plurality of data signal by a corresponding offset.

3. The apparatus of claim 1, wherein each delayed signal of the plurality of delayed signals has a same logical value for a given period of the clock signal.

4. The apparatus of claim 1, wherein each jitter detection circuit is further configured to accumulate a number of times a particular delayed signal of the plurality of delayed signals was incorrectly captured.

5. The apparatus of claim 1, wherein to identify the one or more delayed signals that were incorrectly captured, each jitter detection circuit is further configured to compare each of the delayed signals to the data signal.

6. A method for operating a plurality of jitter detection circuits, the method comprising:
    generating a plurality of launch clocks dependent upon a clock signal, a plurality of first launch phase signals, and a plurality of second launch phase signals;
    generating a plurality of data signals dependent upon a respective launch clock of the plurality of launch clocks;
    generating a plurality of capture clocks dependent upon the clock signal;
    generating a plurality of sets of delayed data signals, wherein each delayed data signal of a given set of the plurality of sets delayed data signals is dependent upon a respective one of the plurality of data signals;
    capturing each delayed data signal of a given set of the plurality of sets of delayed data signals dependent upon a given one of the plurality of capture clocks to generate a corresponding set of captured data signals; and
    identifying one or more delayed data signals of the given set of the plurality of sets delayed data signals that were incorrectly captured dependent upon the corresponding set of captured data signals;

wherein generating a plurality of launch clocks includes selecting, for a given launch clock of the plurality of launch clocks, a positive phase of the clock signal in response to determining a value of a respective one of the plurality of first launch phase signals captured in a first latch dependent upon the positive phase of the clock signal is a high logic level, and a value of a respective one of the plurality of second launch phase signals captured in a second latch dependent upon a negative phase of the clock signal is a low logic level.

7. The method of claim 6, wherein each delayed data signal of the given set of the plurality of sets of delayed signals is delayed from the respective one of the plurality of data signals by a corresponding offset.

8. The method of claim 6, wherein each delayed data signal of the given set of the plurality of sets of delayed signals has a same logical value for a given period of the clock signal.

9. The method of claim 6, further comprising accumulating a number of times a particular delayed data signal of the given set of plurality of sets of delayed data signals was incorrectly captured.

10. The method of claim 6, wherein identifying the one or more of the given set of the plurality of sets of delayed data signals that were incorrectly captured dependent upon the plurality of captured data signals includes comparing each of the one of the given set of the plurality of sets of delayed data signals to a corresponding one of the plurality of data signals.

11. A system, comprising:
a processor coupled to receive a clock input;
one or more memories, wherein each memory of the one or more memories is coupled to receive the clock input; and
one or more jitter detection circuits, comprising:
a launch clock generation circuit configured to generate a launch clock dependent on the clock input and a launch phase selection signal;
a data generation circuit configured to generate a data signal dependent upon the launch clock;
a capture clock generation circuit configured to generate a capture clock dependent on the clock input;
a delay chain configured to receive the data signal and generate a plurality of delayed signals;
a plurality of clocked storage devices each of which is configured to capture a respective one of the plurality of delayed signals responsive to the capture clock; and
a logic circuit coupled to receive outputs of the plurality of clocked storage devices and configured to identify a clocked storage device of the plurality of clocked storage devices that captures the respective delayed signal in error, wherein the clocked storage device captures the least delayed signal of the plurality of delayed clocks that are captured in error;
wherein the launch phase selection signal includes a first launch phase signal and a second launch phase signal, and wherein to generate the launch clock, the launch clock generation circuit is further configured to select a positive phase of the clock input in response to determining a value of a respective one of the plurality of first launch phase signals captured in a first latch dependent upon the positive phase of the clock input is a high logic level, and a value of a respective one of the plurality of second launch phase signals captured in a second latch dependent upon a negative phase of the clock input is a low logic level.

12. The system of claim 11, wherein the delay chain further comprises a series connection of buffer circuits, and wherein each delayed signal of the plurality of delayed signals is the same binary state on a given clock cycle.

13. The system of claim 11, wherein the delay chain comprises a series connection of inverter circuits, and wherein the plurality of delayed signals alternate binary states on a given clock cycle.

14. The system of claim 11, wherein the data generator includes an equivalent critical path circuit configured to approximate a critical path of an integrated circuit.

15. The system of claim 11, further comprising a second plurality of clocked storage devices coupled to the logic circuit and to receive the clock input, wherein the second plurality of clocked storage devices is configured to accumulate an indication of which of the plurality clocked storage devices captured its respective delayed signal in error.

16. The system of claim 11, wherein to identify the clocked storage device of the plurality of clocked storage devices that captures the respective delayed signal in error, the logic circuit is further configured to compare each output of the plurality of clocked storage devices to the data signal.

* * * * *